(12) United States Patent
Hano et al.

(10) Patent No.: US 10,784,856 B2
(45) Date of Patent: Sep. 22, 2020

(54) SEMICONDUCTOR DEVICE

(71) Applicant: Mitsubishi Electric Corporation, Tokyo (JP)

(72) Inventors: Mitsutaka Hano, Tokyo (JP); Akihisa Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/582,272

(22) Filed: Sep. 25, 2019

(65) Prior Publication Data

US 2020/0169253 A1 May 28, 2020

(30) Foreign Application Priority Data

Nov. 22, 2018 (JP) .................. 2018-218818

(51) Int. Cl.
| | |
|---|---|
| *H03K 3/00* | (2006.01) |
| *H03K 17/687* | (2006.01) |
| *G05F 1/00* | (2006.01) |
| *G05F 3/02* | (2006.01) |
| *H03K 17/16* | (2006.01) |
| *H01L 29/78* | (2006.01) |
| *H02M 1/08* | (2006.01) |
| *H01L 29/40* | (2006.01) |
| *H05B 45/37* | (2020.01) |

(52) U.S. Cl.
CPC ......... *H03K 17/168* (2013.01); *H01L 29/404* (2013.01); *H01L 29/7818* (2013.01); *H01L 29/7823* (2013.01); *H02M 1/08* (2013.01); *H03K 17/165* (2013.01); *H05B 45/37* (2020.01)

(58) Field of Classification Search
CPC .... H03K 17/168; H03K 17/165; H05B 45/37; H01L 29/404; H01L 29/7823; H01L 29/7818; H02M 1/08
See application file for complete search history.

(56) References Cited

U.S. PATENT DOCUMENTS

| 5,502,632 A * | 3/1996 | Warmerdam | ........ H03K 17/063 363/98 |
|---|---|---|---|
| 5,666,280 A * | 9/1997 | Janaswamy | ........... H02M 7/003 363/17 |
| 7,514,908 B2 * | 4/2009 | Hosokawa | ............... H03F 3/217 323/222 |
| 7,538,583 B2 * | 5/2009 | Bryson | .................. H03F 3/2171 326/83 |
| 8,154,334 B2 * | 4/2012 | Wang | .................. H02M 3/1588 327/536 |

(Continued)

FOREIGN PATENT DOCUMENTS

| JP | 2007513543 A | 5/2007 |
|---|---|---|
| WO | 2005050703 A2 | 6/2005 |

*Primary Examiner* — Kenneth B Wells
(74) *Attorney, Agent, or Firm* — Studebaker & Brackett PC

(57) ABSTRACT

A semiconductor device includes a first drive circuit and a bootstrap control circuit. When a voltage $V_B$ is equal to or smaller than a power supply voltage $V_{CC}$, the boost control circuit turns on a MOSFET by controlling a gate signal input to a gate terminal, and a back gate control circuit makes a voltage applied to a back gate terminal smaller than the voltage $V_B$.

11 Claims, 7 Drawing Sheets

(56) References Cited

U.S. PATENT DOCUMENTS

| | | | |
|---|---|---|---|
| 8,970,185 B1 * | 3/2015 | Sutardja | H02M 3/1588 |
| | | | 323/266 |
| 9,178,408 B2 * | 11/2015 | Zuniga | H02M 3/156 |
| 9,559,687 B2 * | 1/2017 | Kanda | H03K 17/6872 |
| 2005/0102128 A1 | 5/2005 | Wilhelm | |

* cited by examiner

SEMICONDUCTOR DEVICE

BACKGROUND OF THE INVENTION

Field of the Invention

A technique disclosed in the present specification relates to a semiconductor device.

Description of the Background Art

Conventionally, a technique of mounting a bootstrap diode (i.e., BSD) in a semiconductor device such as a high withstand voltage IC is employed.

In the high withstand voltage IC, the bootstrap diode functions by a P-type well region and a P-type diffusion layer being formed apart from each other.

Then, when a low voltage side IGBT etc. is turned on, a bootstrap capacitor is charged through the bootstrap diode, so that a method which is not necessary to separately provide a floating power supply on a high voltage side floating supply absolute voltage $V_B$ side can be provided.

However, when the bootstrap diode is mounted on the high withstand voltage IC, an anode terminal of the bootstrap diode becomes higher in potential than a cathode terminal thereof by a power supply voltage. Therefore, a parasitic transistor operates in a direction from the anode terminal of the bootstrap diode to a semiconductor substrate. Accordingly, a problem that consumption current of the power supply voltage becomes very large arises.

Therefore, a bootstrap diode emulator circuit that mimics the bootstrap diode may be used. The bootstrap diode emulator circuit generally operates in synchronization with a drive input voltage $L_{IN}$ of a low voltage side drive circuit, as an example is shown in Japanese Unexamined Patent Application Publication (Translation of PCT Application) No. 2007-513543.

However, when the bootstrap diode emulator circuit is operated in synchronization with the drive input voltage $L_{IN}$ of the low voltage side drive circuit, the bootstrap diode emulator circuit depends on drive of the low voltage side drive circuit.

Therefore, there is a problem that the high voltage side floating supply absolute voltage $V_B$ of the high voltage side drive circuit cannot be charged during operation independent of the drive of the low voltage side drive circuit such as a reflux mode of a power device.

In addition, there is a problem that the above technique cannot be applied to an IC not having a low voltage side drive circuit, for example, an IC having only a high voltage side drive circuit used for a DC-DC converter (chopper type) application.

SUMMARY

A purpose of the technique disclosed in the present specification is to provide a technique capable of charging a power supply voltage of a high voltage side drive circuit without depending on drive of a low voltage side drive circuit and capable of preventing operation of a parasitic transistor.

A first aspect of the technique disclosed in the present specification includes: a first drive circuit for driving a first power device; and a bootstrap control circuit connected to the first drive circuit, wherein in the first drive circuit, a voltage obtained by charging a power supply voltage $V_{CC}$ based on a GND potential is supplied to a capacitor connected between a $V_B$ terminal indicating a power supply voltage of the first drive circuit and a $V_S$ terminal indicating a reference voltage of the first drive circuit, the bootstrap control circuit includes an N-type MOSFET, a boost control circuit connected to a gate terminal of the MOSFET, a back gate control circuit connected to a back gate terminal of the MOSFET, and a $V_B$ potential detection circuit connected to the back gate control circuit and for detecting a voltage $V_B$ which is a power supply voltage of the first drive circuit, a drain terminal of the MOSFET is connected to the $V_B$ terminal, a source terminal of the MOSFET is connected to the power supply voltage $V_{CC}$, and when the voltage $V_B$ detected by the $V_B$ potential detection circuit is equal to or smaller than the power supply voltage $V_{CC}$, the boost control circuit turns on the MOSFET by controlling a gate signal input to the gate terminal, and the back gate control circuit makes a voltage applied to the back gate terminal smaller than the voltage $V_B$.

In addition, a second aspect of the technique disclosed in the present specification includes: a first drive circuit for driving a first power device; and a bootstrap control circuit connected to the first drive circuit, wherein in the first drive circuit, a voltage obtained by charging a power supply voltage $V_{CC}$ based on a GND potential is supplied to a capacitor connected between a $V_B$ terminal indicating a power supply voltage of the first drive circuit and a $V_S$ terminal indicating a reference voltage of the first drive circuit, the bootstrap control circuit includes an N-type MOSFET, a boost control circuit connected to a gate terminal of the MOSFET, a back gate control circuit connected to a back gate terminal of the MOSFET, and a $V_S$ potential detection circuit connected to the back gate control circuit and for detecting a voltage $V_S$ which is a reference voltage of the first drive circuit, a drain terminal of the MOSFET is connected to the $V_B$ terminal, a source terminal of the MOSFET is connected to the power supply voltage $V_{CC}$, and when the voltage $V_S$ detected by the $V_S$ potential detection circuit is equal to or smaller than the GND potential, the boost control circuit turns on the MOSFET by controlling a gate signal input to the gate terminal, and the back gate control circuit makes a voltage applied to the back gate terminal smaller than the voltage $V_B$.

According to the first and second aspects of the technique disclosed in the present specification, an increase in consumption current of the power supply voltage is suppressed by preventing operation of a parasitic transistor by voltage control of the back gate control circuit, and further, the power supply voltage of the first drive circuit can be charged by turning on the N-type MOSFET in the bootstrap control circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
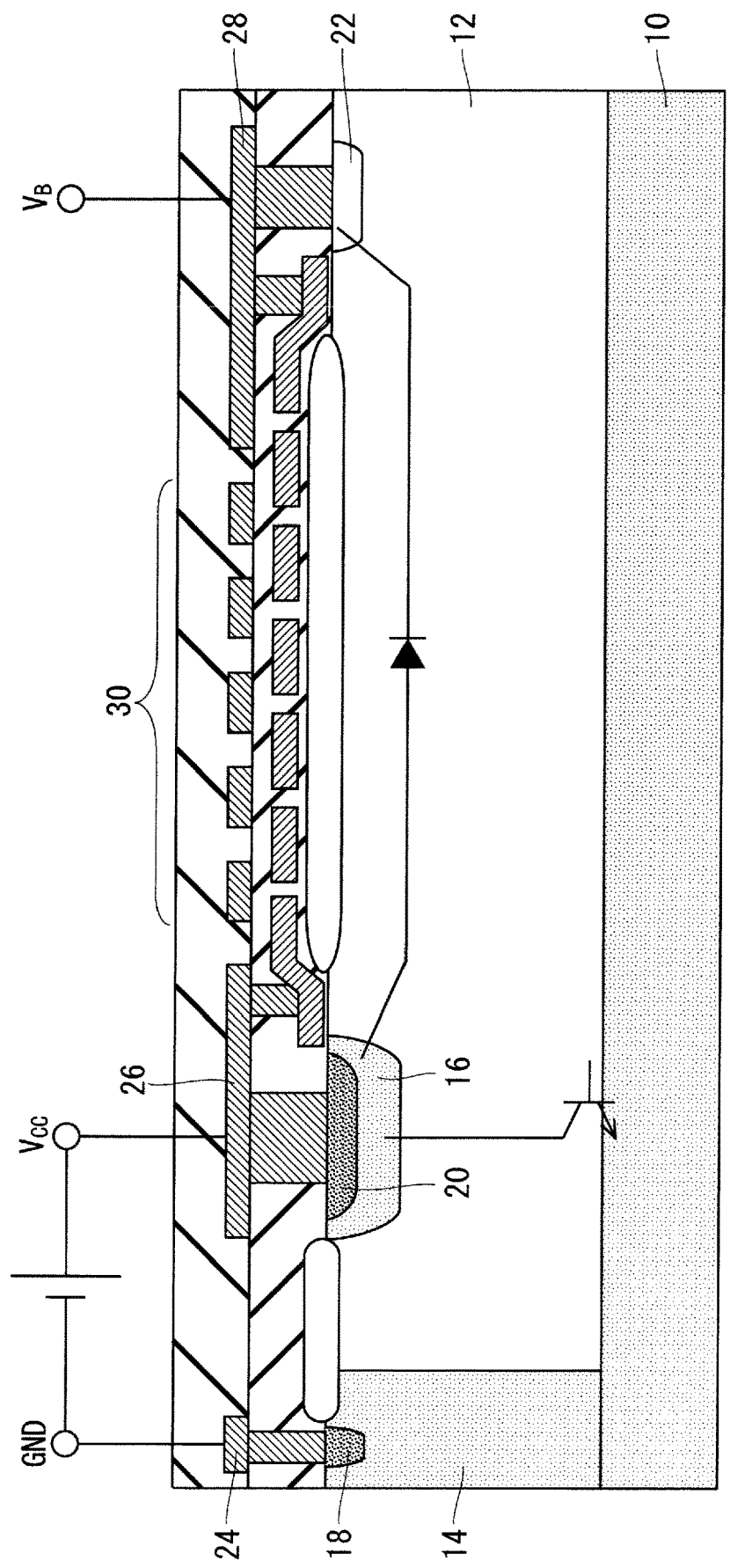
FIG. 1 is a cross-sectional view showing an example of a configuration of a bootstrap diode related to a preferred embodiment.

Hereinafter, preferred embodiments will be described with reference to the accompanying drawings. Examples of effects produced by the preferred embodiments are collectively described after explanation of all the preferred embodiments.

It should be noted that the drawings are schematically shown and, and for convenience of description, omission of a configuration or simplification of the configuration is made as appropriate. Also, a mutual relationship between sizes and positions of configurations and the like shown in different drawings is not necessarily described accurately and can be appropriately changed. In addition, even in drawings such as plan views that are not cross-sectional views, hatching may be given to facilitate understanding of contents of the preferred embodiments.

In addition, in the following description, the same components are denoted by the same reference numerals, and they have the same names and functions. Therefore, detailed description thereof may be omitted in order to avoid duplication.

Also, in the explanation described below, though terms meaning specific positions and directions such as "upper", "lower", "left", "right", "side", "bottom", "front", or "back" are sometimes used, these terms are used for the sake of convenience to facilitate understanding of the contents of the preferred embodiments, and are not related to the directions in which they are actually implemented.

In addition, in the explanation described below, even if ordinal numbers such as "first" or "second" may be used, these terms are used for the sake of convenience to facilitate understanding of the contents of the preferred embodiments, and are not limited to an order etc. which may be caused by these ordinal numbers.

First Preferred Embodiment

A semiconductor device according to the present preferred embodiment will be described below. For convenience of explanation, first, a bootstrap diode related to the present preferred embodiment will be described.

FIG. 1 is a cross-sectional view showing an example of a configuration of the bootstrap diode related to the present preferred embodiment. As the example is shown in FIG. 1, the bootstrap diode includes a P$^-$-type semiconductor substrate 10, an N-type well region 12 partially formed in a surface layer of the P$^-$-type semiconductor substrate 10, a P-type well region 14 partially formed in the surface layer of the P$^-$-type semiconductor substrate 10, a P-type diffusion layer 16 partially formed in a surface layer of the N-type well region 12, a P$^+$-type contact layer 18 partially formed in a surface layer of the P-type well region 14, a P$^+$-type contact layer 20 partially formed in a surface layer of the P-type diffusion layer 16, an N$^+$-type contact layer 22 partially formed in the surface layer of the N-type well region 12, a GND electrode 24 connected to an upper surface of the P$^+$-type contact layer 18, an anode electrode 26 connected to an upper surface of the P$^+$-type contact layer 20, a cathode electrode 28 connected to an upper surface of the N$^+$-type contact layer 22, and a multiple floating field plate (MFFP) structure 30 formed between the anode electrode 26 and the cathode electrode 28.

The bootstrap diode functions by the P-type well region 14 and the P-type diffusion layer 16 being formed apart from each other.

Figure 2:
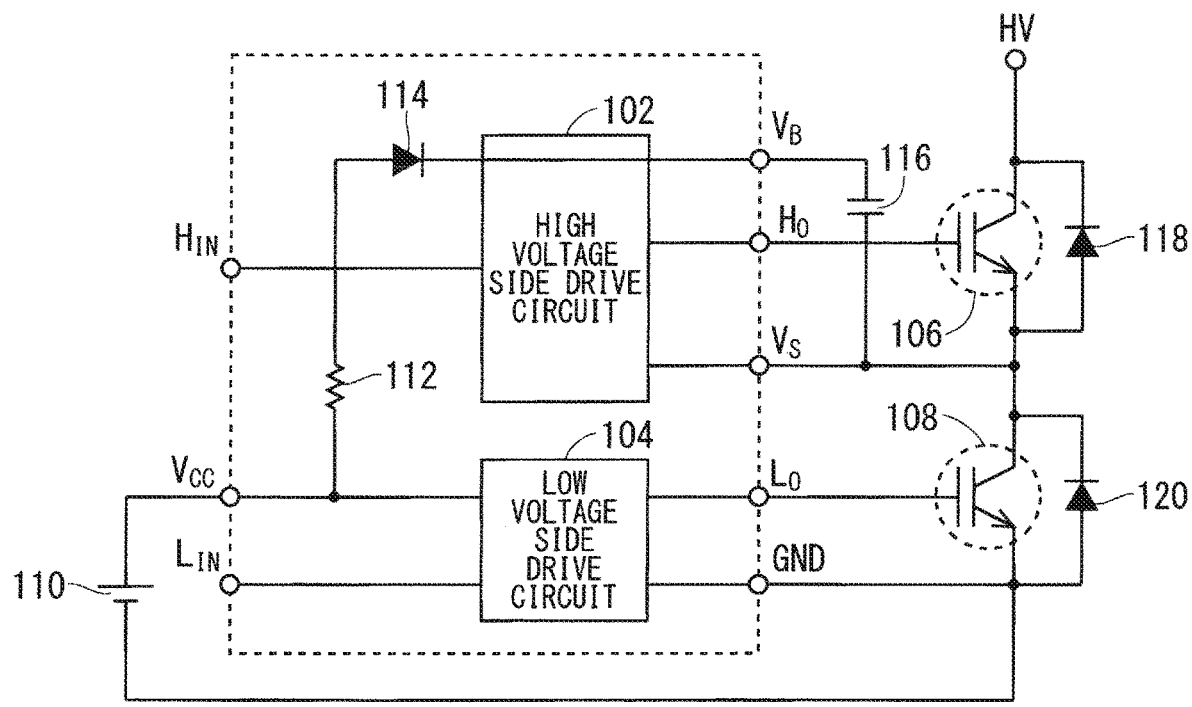
FIG. 2 is a circuit diagram showing an example of a configuration of a high withstand voltage IC including a power device and a bootstrap diode, which is related to the preferred embodiment.

FIG. 2 is a circuit diagram showing an example of a configuration of a high withstand voltage IC including a power device and a bootstrap diode related to the present preferred embodiment. In FIG. 2, an insulated gate bipolar transistor (i.e., IGBT) is used as an example of the power device. Note that the power device may be, for example, a metal-oxide-semiconductor field-effect transistor (i.e., MOSFET).

As the example is shown in FIG. 2, the high withstand voltage IC includes a high voltage side drive circuit 102, a low voltage side drive circuit 104, and an IGBT 106 in which an output voltage H$_O$ of the high voltage side drive circuit 102 is input to a gate terminal, a free wheeling diode 118 whose cathode terminal is connected to a collector terminal of the IGBT 106 and whose anode terminal is connected to an emitter terminal of the IGBT 106, an IGBT 108 totem-pole connected with the IGBT 106 and in which an output voltage L$_O$ of the low voltage side drive circuit 104 is input to a gate terminal, a free wheeling diode 120 whose cathode terminal is connected to a collector terminal of the IGBT 108 and whose anode terminal is connected to an emitter terminal of the IGBT 108, a power supply 110 for supplying a power supply voltage V$_{CC}$ based on a GND potential, a resistor 112 connected to the power supply voltage V$_{CC}$, a high withstand voltage diode 114 whose anode terminal is connected to the resistor 112, and a bootstrap capacitor 116.

Here, a drive input voltage H$_{IN}$ is input to the high voltage side drive circuit 102, and a drive input voltage L$_{IN}$ is input to the low voltage side drive circuit 104.

Further, one end of the bootstrap capacitor 116 is connected to a V$_B$ terminal indicating a high voltage side floating supply absolute voltage V$_B$ which is a power supply voltage of the high voltage side drive circuit 102, to which a cathode terminal of the high withstand voltage diode 114 is connected, and another end of the bootstrap capacitor 116 is connected to a V$_S$ terminal indicating a high voltage side floating supply offset voltage V$_S$ which is a reference voltage of the high voltage side drive circuit 102. Note that the V$_S$ terminal of the high voltage side floating supply offset voltage V$_S$ of the high voltage side drive circuit 102 is connected to the emitter terminal of the IGBT 106 and the collector terminal of the IGBT 108.

Further, a GND terminal of the low voltage side drive circuit 104 is connected to the emitter terminal of the IGBT 108 together with the power supply 110.

Then, when the low voltage side IGBT 108 is turned on, the bootstrap capacitor 116 is charged via the high withstand voltage diode 114, so that a method which is not necessary to separately provide a floating power supply on the high voltage side floating supply absolute voltage V$_B$ side can be provided.

However, when the bootstrap diode is mounted on the high withstand voltage IC, the anode terminal of the high withstand voltage diode 114 becomes higher in potential than the cathode terminal thereof by the power supply voltage V$_{cc}$. Therefore, a parasitic PNP transistor operates in a direction from the anode terminal (that is, the anode electrode 26 in FIG. 1) of the high withstand voltage diode 114 toward the P⁻-type semiconductor substrate 10. Then, there arises a problem that consumption current of the power supply voltage $V_{CC}$ becomes extremely large.

Therefore, a bootstrap diode emulator circuit that mimics the bootstrap diode may be used. The bootstrap diode emulator circuit generally operates in synchronization with a drive input voltage $L_{IN}$ of a low voltage side drive circuit, as an example is shown in Japanese Unexamined Patent Application Publication (Translation of PCT Application) No. 2007-513543.

<Configuration of Semiconductor Device>

Figure 3:
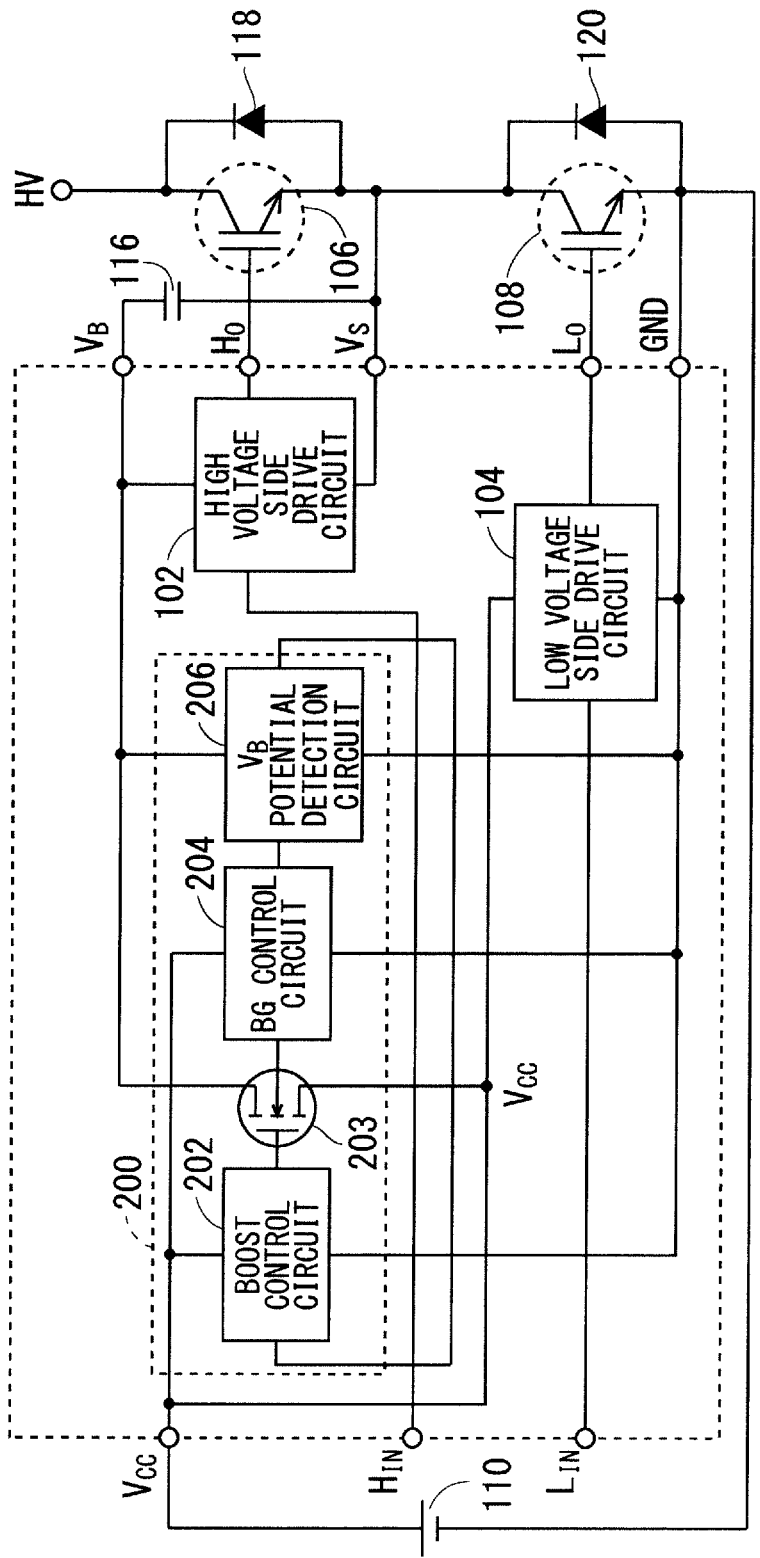
FIG. 3 is a circuit diagram showing an example of a configuration of a monolithic high withstand voltage IC (high withstand voltage IC with one-chip configuration) as a semiconductor device of the preferred embodiment.

FIG. 3 is a circuit diagram showing an example of a configuration of a monolithic high withstand voltage IC (high withstand voltage IC with one-chip configuration) as the semiconductor device of the present preferred embodiment. As shown in FIG. 3, the high withstand voltage IC includes a high voltage side drive circuit 102, a low voltage side drive circuit 104, an IGBT 106, a free wheeling diode 118, an IGBT 108, a free wheeling diode 120, a power supply 110, a bootstrap capacitor 116, and a bootstrap control circuit 200. Note that a power device may be, for example, a MOSFET.

The bootstrap control circuit 200 is connected to power supply voltages $V_{CC}$, a GND terminal of the low voltage side drive circuit 104, and a high voltage side floating supply absolute voltage $V_B$ of the high voltage side drive circuit 102.

Specifically, the bootstrap control circuit 200 includes an N-type MOSFET 203, a boost control circuit 202 connected to a gate terminal of the N-type MOSFET 203, a BG control circuit 204 connected to a back gate terminal of the N-type MOSFET 203, and a $V_B$ potential detection circuit 206 connected to the BG control circuit 204.

A drain terminal of the N-type MOSFET 203 is connected to the high voltage side floating supply absolute voltage $V_B$ of the high voltage side drive circuit 102. Further, a source terminal of the N-type MOSFET 203 is connected to the power supply voltage $V_{CC}$.

Further, the boost control circuit 202 is connected to the power supply voltage $V_{CC}$ and the GND terminal of the low voltage side drive circuit 104.

Further, the BG control circuit 204 is connected to the power supply voltage $V_{CC}$ and the GND terminal of the low voltage side drive circuit 104.

Further, the $V_B$ potential detection circuit 206 is connected to the high voltage side floating supply absolute voltage $V_B$ of the high voltage side drive circuit 102, the GND terminal of the low voltage side drive circuit 104, and the boost control circuit 202.

The low voltage side drive circuit 104 is supplied with the power supply voltage $V_{CC}$. On the other hand, the high voltage side drive circuit 102 is supplied with a potential obtained by charging the bootstrap capacitor 116 with the power supply voltage $V_{CC}$ by the bootstrap control circuit 200.

Figure 4:
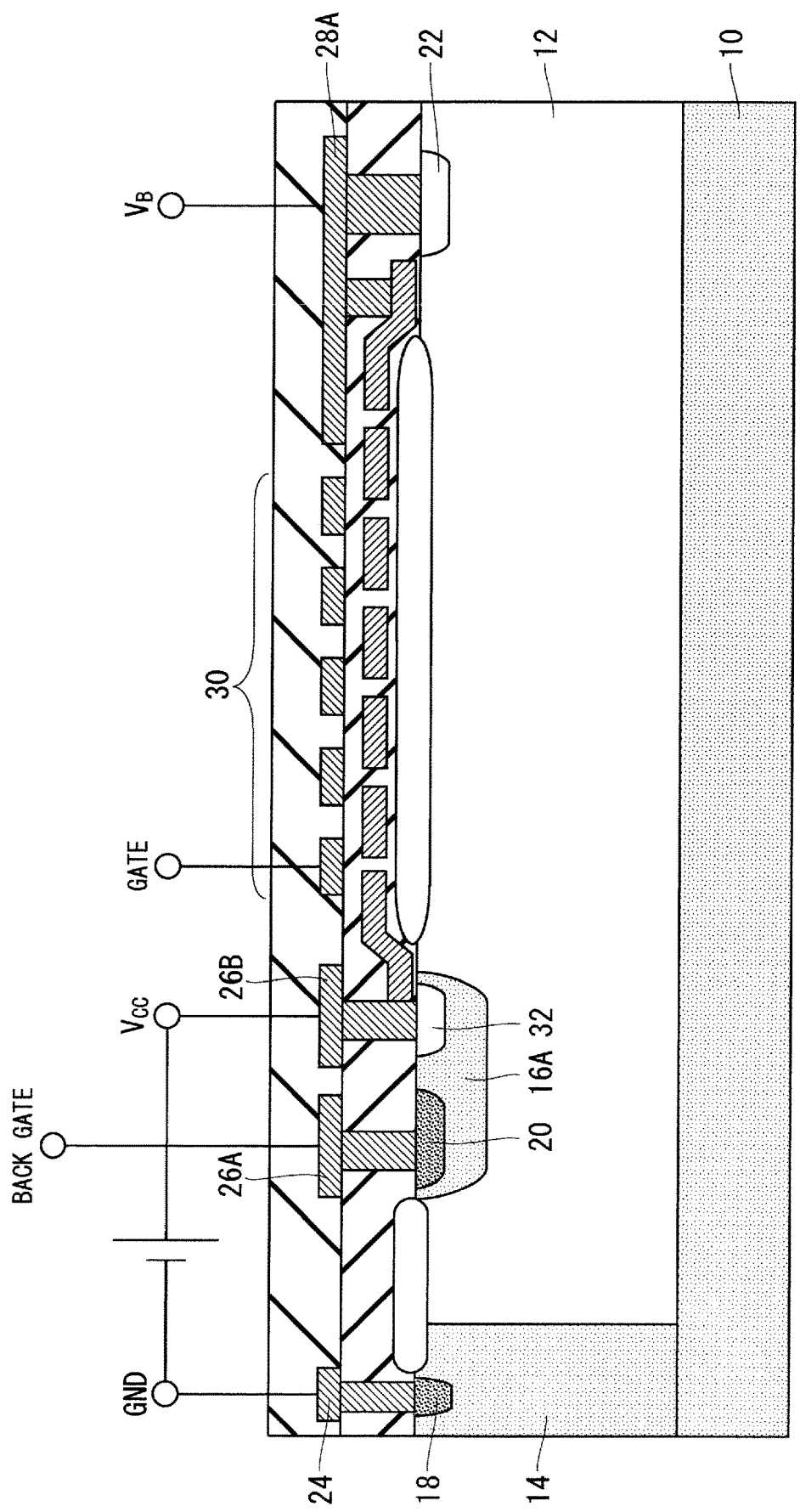
FIG. 4 is a cross-sectional view showing an example of a configuration of an N-type MOSFET in FIG. 3.

FIG. 4 is a cross-sectional view showing an example of a configuration of the N-type MOSFET in FIG. 3. As the example is shown in FIG. 4, the N-type MOSFET includes a P⁻-type semiconductor substrate 10, an N-type well region 12, a P-type well region 14, a P⁻-type diffusion layer 16A partially formed in a surface layer of the N-type well region 12, a P⁺-type contact layer 18, a P⁺-type contact layer 20 partially formed in a surface layer of the P‴-type diffusion layer 16A, an N⁺-type contact layer 32 partially formed in the surface layer of the P⁻-type diffusion layer 16A, an N⁺-type contact layer 22, a GND electrode 24, a back gate electrode 26A connected to an upper surface of the P⁺-type contact layer 20, a source electrode 26B connected to an upper surface of the N⁺-type contact layer 32, a drain electrode 28A connected to an upper surface of the N⁺-type contact layer 22, and an MFFP structure 30 formed between the source electrode 26B and the drain electrode 28A.

A drain terminal connected to the drain electrode 28A of the N-type MOSFET whose example is shown in FIG. 4 is connected to the high voltage side floating supply absolute voltage $V_B$ of the high voltage side drive circuit 102. Further, a source terminal connected to the source electrode 26B of the N-type MOSFET is connected to the power supply voltage $V_{CC}$.

Further, a back gate terminal connected to the back gate electrode 26A of the N-type MOSFET is connected to the BG control circuit 204 in FIG. 3. Further, a gate terminal connected to the MFFP structure 30 of the N-type MOSFET is connected to the boost control circuit 202.

In the above configuration, based on a voltage value detected in the $V_B$ potential detection circuit 206 (that is, the high voltage side floating supply absolute voltage $V_B$ which is the power supply voltage of the high voltage side drive circuit 102), the bootstrap control circuit 200 can perform a charging operation to the high voltage side floating supply absolute voltage $V_B$ of the high voltage side drive circuit 102 independently of the drive input voltage $L_{IN}$ of the low voltage side drive circuit 104.

Specifically, when the voltage value detected in the $V_B$ potential detection circuit 206 is equal to or smaller than the power supply voltage $V_{CC}$, that is, when (voltage between high voltage side floating supply absolute voltage $V_B$ and GND) (voltage between power supply voltage $V_{CC}$ and GND), the boost control circuit 202 turns on the N-type MOSFET 203 based on a signal from the $V_B$ potential detection circuit 206. Furthermore, the BG control circuit 204 controls a voltage applied to the back gate terminal such that (voltage between back gate terminal and GND)<(voltage between high voltage side floating supply absolute voltage $V_B$ and GND).

On the other hand, when the voltage value detected in the $V_B$ potential detection circuit 206 is larger than the power supply voltage $V_{CC}$, that is, when (voltage between high voltage side floating supply absolute voltage $V_B$ and GND) >(voltage between power supply voltage $V_{CC}$ and GND), the boost control circuit 202 turns off the N-type MOSFET 203 based on the signal from the $V_B$ potential detection circuit 206. Furthermore, the BG control circuit 204 controls the voltage applied to the back gate terminal such that (voltage between back gate terminal and GND)=(voltage between power supply voltage $V_{CC}$ and GND).

According to the above operation, regardless of a magnitude relationship between (voltage between high voltage side floating supply absolute voltage $V_B$ and GND) and (voltage between power supply voltage $V_{CC}$ and GND), it is possible to maintain a state of (voltage between back gate terminal and GND)≤(voltage between high voltage side floating supply absolute voltage $V_B$ and GND). Therefore, generation of a parasitic PNP transistor can be prevented.

Second Preferred Embodiment

A semiconductor device according to the present preferred embodiment will be described. Note that, in the following description, the same components as those described in the above-described preferred embodiment are denoted by the same reference numerals, and detailed description thereof is appropriately omitted.

<Configuration of Semiconductor Device>

Figure 5:
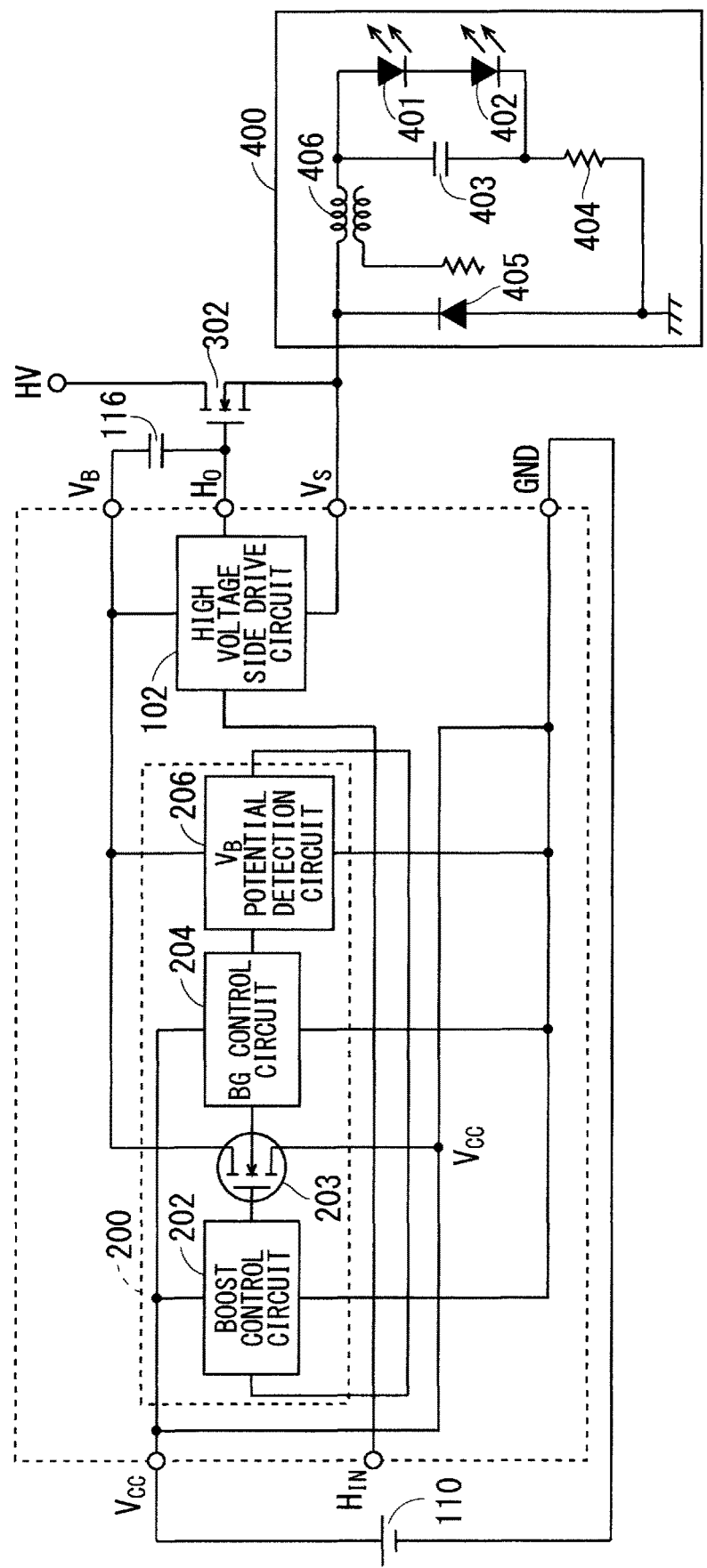
FIGS. 5 and 7 are circuit diagrams each showing an example of a configuration of a high withstand voltage IC as a semiconductor device of a preferred embodiment.

FIG. 5 is a circuit diagram showing an example of a configuration of a high withstand voltage IC as the semiconductor device of the present preferred embodiment. The configuration shown in FIG. 5 is, for example, a configuration used for a DC-DC converter (chopper type) such as an LED power supply.

As shown in FIG. 5, the high withstand voltage IC includes a high voltage side drive circuit 102, an N-type MOSFET 302 in which an output voltage $H_O$ of the high voltage side drive circuit 102 is input to a gate terminal, an LED power supply unit 400 connected to a source terminal of the MOSFET 302, a power supply 110, a bootstrap capacitor 116, and a bootstrap control circuit 200. Note that a power device may be, for example, an IGBT.

The LED power supply unit 400 includes an LED 401 and an LED 402 connected in series, a capacitor 403 connected in parallel with the LED 401 and the LED 402, a resistor 404 connected in series with the LED 401 and the LED 402, a diode 405, and a coil 406.

As the example is shown in FIG. 5, even in a case of the high withstand voltage IC having only the high voltage side drive circuit 102 used for the DC-DC converter (chopper type) etc., based on a voltage value detected in a $V_B$ potential detection circuit 206, the bootstrap control circuit 200 can perform charging operation to a high voltage side floating supply absolute voltage $V_B$ of the high voltage side drive circuit 102 independently of a drive input voltage $L_{IN}$ of a low voltage side drive circuit.

Specifically, when the voltage value detected in the $V_B$ potential detection circuit 206 is equal to or smaller than the power supply voltage $V_{CC}$, that is, when (voltage between high voltage side floating supply absolute voltage $V_B$ and GND)≤(voltage between power supply voltage $V_{CC}$ and GND), the boost control circuit 202 turns on the N-type MOSFET 203 based on a signal from the $V_B$ potential detection circuit 206. Furthermore, the BG control circuit 204 controls a voltage applied to the back gate terminal such that (voltage between back gate terminal and GND)<(voltage between high voltage side floating supply absolute voltage $V_B$ and GND).

On the other hand, when the voltage value detected in the $V_B$ potential detection circuit 206 is larger than the power supply voltage $V_{CC}$, that is, when (voltage between high voltage side floating supply absolute voltage $V_B$ and GND)>(voltage between power supply voltage $V_{CC}$ and GND), the boost control circuit 202 turns off the N-type MOSFET 203 based on the signal from the $V_B$ potential detection circuit 206. Furthermore, the BG control circuit 204 controls the voltage applied to the back gate terminal such that (voltage between back gate terminal and GND)=(voltage between power supply voltage $V_{CC}$ and GND).

According to the above operation, regardless of a magnitude relationship between (voltage between high voltage side floating supply absolute voltage $V_B$ and GND) and (voltage between power supply voltage $V_{CC}$ and GND), it is possible to maintain a state of (voltage between back gate terminal and GND)≤(voltage between high voltage side floating supply absolute voltage $V_B$ and GND). Therefore, generation of a parasitic PNP transistor can be prevented.

Third Preferred Embodiment

A semiconductor device according to the present preferred embodiment will be described. Note that, in the following description, the same components as those described in the above-described preferred embodiment are denoted by the same reference numerals, and detailed description thereof is appropriately omitted.

<Configuration of Semiconductor Device>

Figure 6:
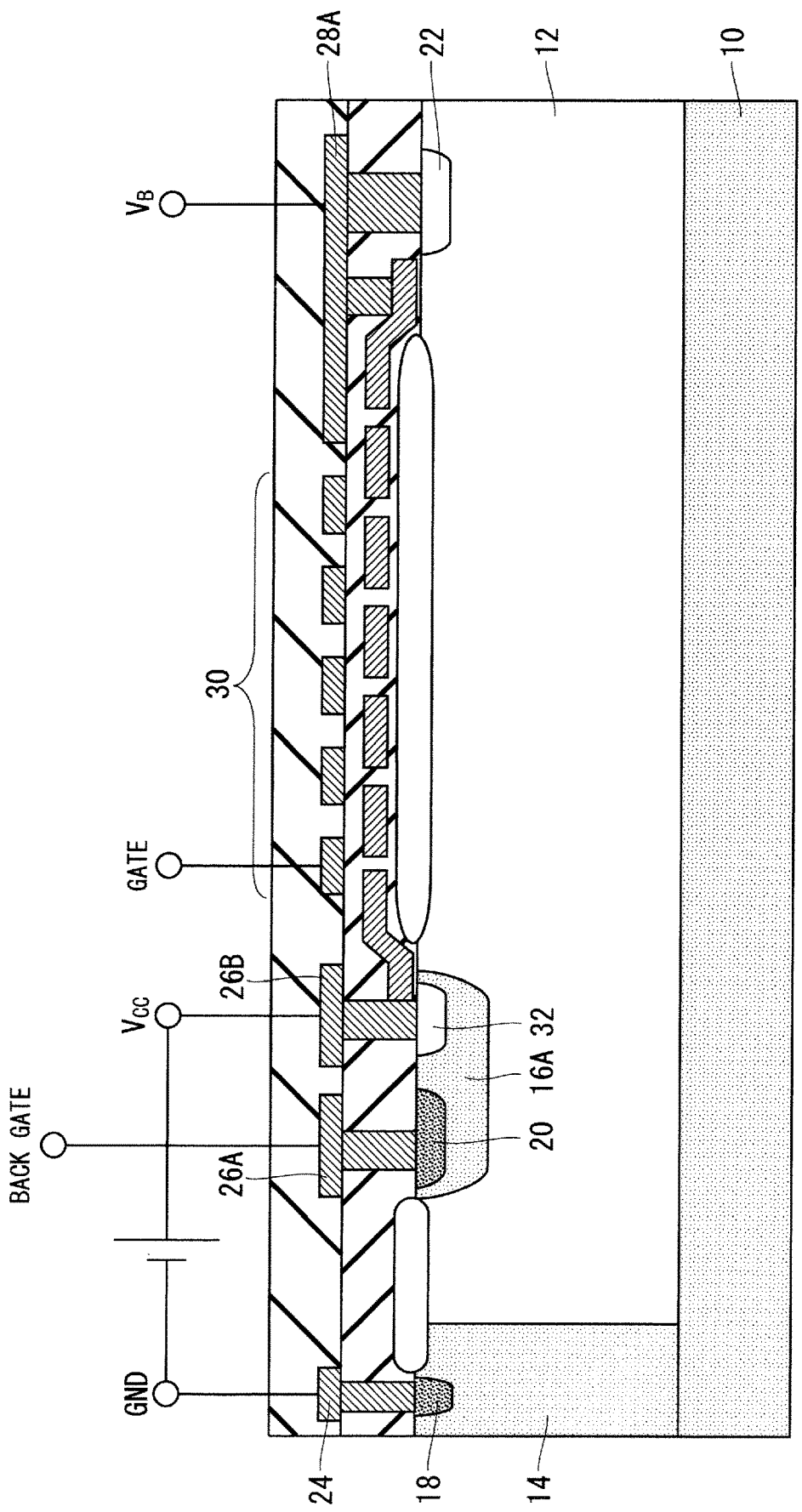
FIG. 6 is a cross-sectional view showing an example of a configuration of an N-type MOSFET in FIG. 5.

FIG. 6 is a cross-sectional view showing an example of a configuration of the N-type MOSFET in FIG. 5. As the example is shown in FIG. 6, the N-type MOSFET includes a $P^-$-type semiconductor substrate 10, an N-type well region 12, a P-type well region 14, a $P^-$-type diffusion layer 16A, a $P^+$-type contact layer 18, a $P^+$-type contact layer 20, an $N^+$-type contact layer 32, an $N^+$-type contact layer 22, a GND electrode 24, a back gate electrode 26A, a source electrode 26B, a drain electrode 28A, and an MFFP structure 30.

A drain terminal connected to the drain electrode 28A of the N-type MOSFET whose example is shown in FIG. 6 is connected to the high voltage side floating supply absolute voltage $V_B$ of the high voltage side drive circuit 102. Further, a source terminal connected to the source electrode 26B of the N-type MOSFET is connected to the power supply voltage $V_{CC}$.

Further, a back gate terminal connected to the back gate electrode 26A of the N-type MOSFET is connected to the BG control circuit 204 in FIG. 5. Further, a gate terminal connected to the MFFP structure 30 of the N-type MOSFET is connected to the boost control circuit 202.

Based on the voltage values detected in the $V_B$ potential detection circuits 206 in FIGS. 3 and 5, the bootstrap control circuit 200 can perform charging operation to the high voltage side floating supply absolute voltage $V_B$ of the high voltage side drive circuit 102 without depending on the drive input voltage $L_{IN}$ of the low voltage side drive circuit 104.

Specifically, when the voltage value detected in the $V_B$ potential detection circuit 206 is equal to or smaller than the power supply voltage $V_{CC}$, that is, when (voltage between high voltage side floating supply absolute voltage $V_B$ and GND) (voltage between power supply voltage $V_{CC}$ and GND), the boost control circuit 202 turns on the N-type MOSFET 203 based on a signal from the $V_B$ potential detection circuit 206. Furthermore, the BG control circuit 204 controls a voltage applied to the back gate terminal such that (voltage between back gate terminal and GND)<(voltage between high voltage side floating supply absolute voltage $V_B$ and GND) and that (voltage between source terminal and back gate terminal)<(reverse withstand voltage of PN junction).

On the other hand, when the voltage value detected in the $V_B$ potential detection circuit 206 is larger than the power supply voltage $V_{CC}$, that is, when (voltage between high voltage side floating supply absolute voltage $V_B$ and GND)>(voltage between power supply voltage $V_{CC}$ and GND), the boost control circuit 202 turns off the N-type MOSFET 203 based on the signal from the $V_B$ potential detection circuit 206. Furthermore, the BG control circuit 204 controls the voltage applied to the back gate terminal such that (voltage between back gate terminal and GND)=(voltage between power supply voltage $V_{CC}$ and GND).

According to the above operation, regardless of a magnitude relationship between (voltage between high voltage side floating supply absolute voltage $V_B$ and GND) and (voltage between power supply voltage $V_{CC}$ and GND), it is possible to maintain a state of (voltage between back gate terminal and GND) S (voltage between high voltage side floating supply absolute voltage $V_B$ and GND). Therefore, generation of a parasitic PNP transistor can be prevented.

Further, since the source terminal connected to the power supply voltage $V_{CC}$ is connected to the N$^+$-type contact layer 32 and the back gate terminal is connected to the P$^+$-type contact layer 20, if the voltage between the source terminal and the back gate terminal is large, the reverse withstand voltage of the PN junction cannot be maintained. Therefore, for example, by fixing (voltage between source terminal and back gate terminal) to approximately 8 V (6.5 V at the minimum value), the reverse withstand voltage of the PN junction can be maintained.

Fourth Preferred Embodiment

A semiconductor device according to the present preferred embodiment will be described. Note that, in the following description, the same components as those described in the above-described preferred embodiment are denoted by the same reference numerals, and detailed description thereof is appropriately omitted.

Based on the voltage values detected in the $V_B$ potential detection circuits 206 in FIGS. 3 and 5, the bootstrap control circuit 200 can perform charging operation to the high voltage side floating supply absolute voltage $V_B$ of the high voltage side drive circuit 102 without depending on the drive input voltage $L_{IN}$ of the low voltage side drive circuit 104.

Specifically, when the voltage value detected in the $V_B$ potential detection circuit 206 is equal to or smaller than the power supply voltage $V_{CC}$, that is, when (voltage between high voltage side floating supply absolute voltage $V_B$ and GND)≤(voltage between power supply voltage $V_{CC}$ and GND), the boost control circuit 202 turns on the N-type MOSFET 203 based on a signal from the $V_B$ potential detection circuit 206. Furthermore, the BG control circuit 204 controls a voltage applied to the back gate terminal such that (voltage between back gate terminal and GND)<(voltage between high voltage side floating supply absolute voltage $V_B$ and GND) and that (voltage between source terminal and back gate terminal)<(reverse withstand voltage of PN junction).

On the other hand, when the voltage value detected in the $V_B$ potential detection circuit 206 is larger than the power supply voltage $V_{CC}$, that is, when (voltage between high voltage side floating supply absolute voltage $V_B$ and GND)>(voltage between power supply voltage $V_{CC}$ and GND), the boost control circuit 202 turns off the N-type MOSFET 203 based on the signal from the $V_B$ potential detection circuit 206. Furthermore, the BG control circuit 204 controls the voltage applied to the back gate terminal such that (voltage between back gate terminal and GND)<(voltage between power supply voltage $V_{CC}$ and GND) and that (voltage between source terminal and back gate terminal)<(reverse withstand voltage of PN junction).

According to the above operation, regardless of a magnitude relationship between (voltage between high voltage side floating supply absolute voltage $V_B$ and GND) and (voltage between power supply voltage $V_{CC}$ and GND), it is possible to maintain a state of (voltage between back gate terminal and GND)≤(voltage between high voltage side floating supply absolute voltage $V_B$ and GND). Therefore, generation of a parasitic PNP transistor can be prevented.

Further, since the source terminal connected to the power supply voltage $V_{CC}$ is connected to the N$^+$-type contact layer 32 and the back gate terminal is connected to the P$^+$-type contact layer 20, if the voltage between the source terminal and the back gate terminal is large, the reverse withstand voltage of the PN junction cannot be maintained. Therefore, for example, by fixing (voltage between source terminal and back gate terminal) to 8 V (6.5 V at the minimum value), the reverse withstand voltage of the PN junction can be maintained regardless of whether the MOSFET 203 is in a on state or off state.

Fifth Preferred Embodiment

A semiconductor device according to the present preferred embodiment will be described. Note that, in the following description, the same components as those described in the above-described preferred embodiment are denoted by the same reference numerals, and detailed description thereof is appropriately omitted.

<Configuration of Semiconductor Device>

Figure 7:
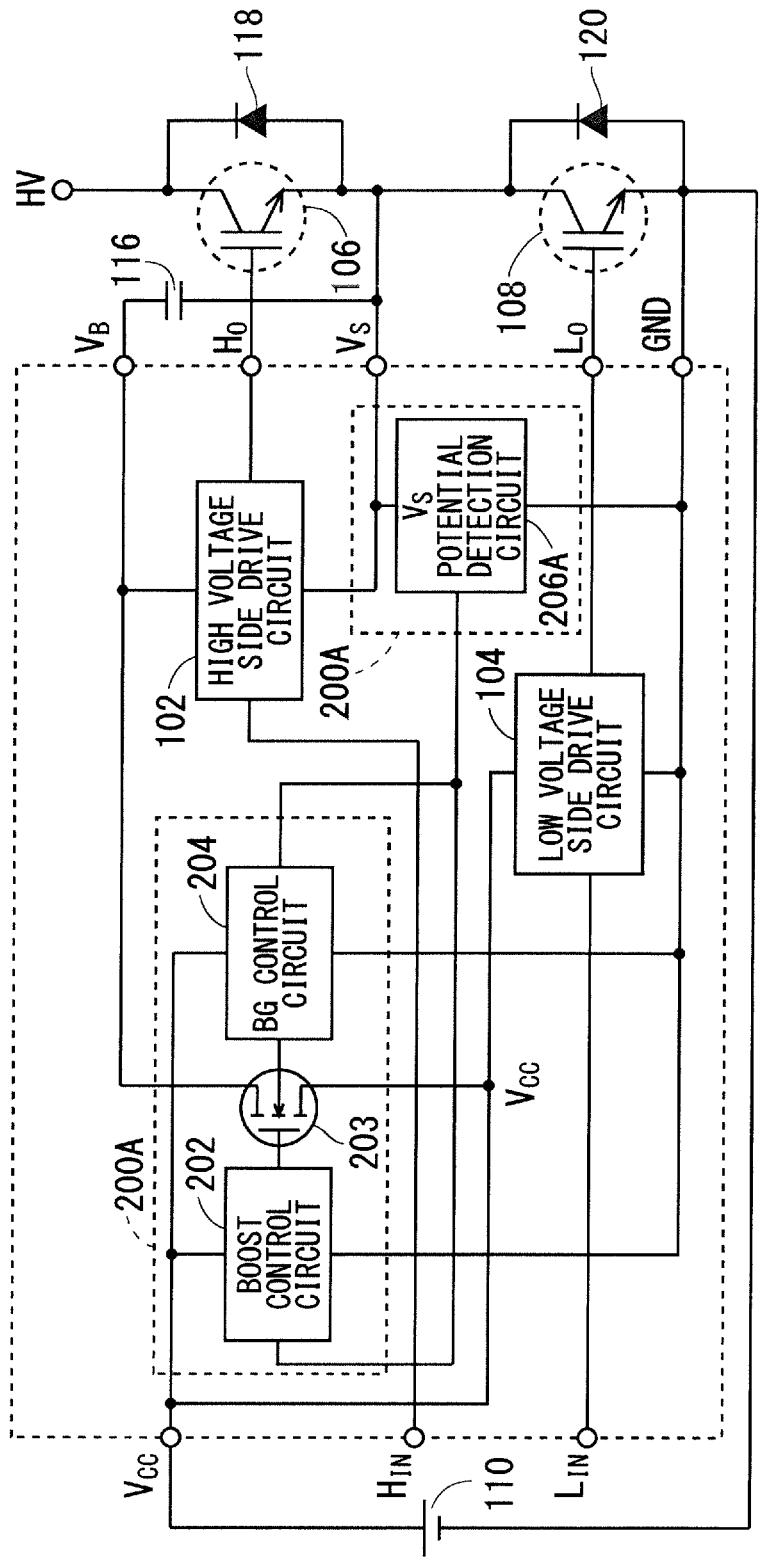

FIG. 7 is a circuit diagram showing an example of a configuration of a high withstand voltage IC as the semiconductor device of the present preferred embodiment. As shown in FIG. 7, the high withstand voltage IC includes a high voltage side drive circuit 102, a low voltage side drive circuit 104, an IGBT 106, a free wheeling diode 118, an IGBT 108, a free wheeling diode 120, a power supply 110, a bootstrap capacitor 116, and a bootstrap control circuit 200A. Note that a power device may be, for example, a MOSFET.

The bootstrap control circuit 200A includes an N-type MOSFET 203, a boost control circuit 202 connected to a gate terminal of the N-type MOSFET 203, a BG control circuit 204 connected to a back gate terminal of the N-type MOSFET 203, and a $V_S$ potential detection circuit 206A connected to the BG control circuit 204.

A drain terminal of the N-type MOSFET 203 is connected to the high voltage side floating supply absolute voltage $V_B$ of the high voltage side drive circuit 102. Further, a source terminal of the N-type MOSFET 203 is connected to the power supply voltage $V_{CC}$.

Further, the boost control circuit 202 is connected to the power supply voltage $V_{CC}$ and the GND terminal of the low voltage side drive circuit 104.

Further, the BG control circuit 204 is connected to the power supply voltage $V_{CC}$ and the GND terminal of the low voltage side drive circuit 104.

Further, the $V_S$ potential detection circuit 206A is connected to a high voltage side floating supply offset voltage $V_S$ of the high voltage side drive circuit 102, the GND terminal of the low voltage side drive circuit 104, and the boost control circuit 202.

The low voltage side drive circuit 104 is supplied with the power supply voltage $V_{CC}$. On the other hand, the high voltage side drive circuit 102 is supplied with a potential obtained by charging the bootstrap capacitor 116 with the power supply voltage $V_{CC}$ based on a GND potential by the bootstrap control circuit 200A.

In the above configuration, based on a voltage value detected in the $V_S$ potential detection circuit 206A (that is, the high voltage side floating supply offset voltage $V_S$ which is a reference voltage of the high voltage side drive circuit 102), the bootstrap control circuit 200A can perform charging operation to the high voltage side floating supply absolute voltage $V_B$ of the high voltage side drive circuit 102 independently of a drive input voltage $L_{IN}$ of the low voltage side drive circuit 104.

Specifically, when the voltage value detected in the $V_S$ potential detection circuit 206A is equal to or smaller than the GND potential, that is, when (voltage between high voltage side floating supply offset voltage $V_S$ and GND)≤(GND potential), the boost control circuit 202 turns on the N-type MOSFET 203 based on a signal from the $V_S$ potential detection circuit 206A. Furthermore, the BG control circuit 204 controls a voltage applied to the back gate terminal such that (voltage between back gate terminal and GND)<(voltage between high voltage side floating supply absolute voltage $V_B$ and GND).

On the other hand, when the voltage value detected in the $V_S$ potential detection circuit 206A is larger than the GND potential, that is, when (voltage between high voltage side floating supply offset voltage $V_S$ and GND)>(GND potential), the boost control circuit 202 turns off the N-type MOSFET 203 based on the signal from the $V_S$ potential detection circuit 206A. Furthermore, the BG control circuit 204 controls the voltage applied to the back gate terminal such that (voltage between back gate terminal and GND)= (voltage between power supply voltage $V_{CC}$ and GND).

According to the above-described operation, regardless of a magnitude relationship between (voltage between high voltage side floating supply offset voltage $V_S$ and GND) and (GND potential), a state of (voltage between back gate terminal and GND) (voltage between high voltage side floating supply absolute voltage $V_B$ and GND) can be maintained. Therefore, generation of a parasitic PNP transistor can be prevented.

Note that the configuration whose example is shown in FIG. 7 may be changed to a configuration in which the low voltage side drive circuit 104 is not provided, that is, as the configuration whose example is shown in FIG. 5, a configuration in which the high voltage side drive circuit 102 and the power device driven by the high voltage side drive circuit 102 are provided and the low voltage side drive circuit 104 and the power device driven by the low voltage side drive circuit 104 are not provided.

Sixth Preferred Embodiment

A semiconductor device according to the present preferred embodiment will be described. Note that, in the following description, the same components as those described in the above-described preferred embodiment are denoted by the same reference numerals, and detailed description thereof is appropriately omitted.

Based on the voltage value detected in the $V_S$ potential detection circuit 206A in FIG. 7, the bootstrap control circuit 200A can perform charging operation to the high voltage side floating supply absolute voltage $V_B$ of the high voltage side drive circuit 102 without depending on the drive input voltage $L_{IN}$ of the low voltage side drive circuit 104.

Specifically, when the voltage value detected in the $V_S$ potential detection circuit 206A is equal to or smaller than the GND potential, that is, when (voltage between high voltage side floating supply offset voltage $V_S$ and GND)≤ (GND potential), the boost control circuit 202 turns on the N-type MOSFET 203 based on a signal from the $V_S$ potential detection circuit 206A. Furthermore, the BG control circuit 204 controls a voltage applied to the back gate terminal such that (voltage between back gate terminal and GND)<(voltage between high voltage side floating supply absolute voltage $V_B$ and GND) and that (voltage between source terminal and back gate terminal)<(reverse withstand voltage of PN junction).

On the other hand, when the voltage value detected in the $V_S$ potential detection circuit 206A is larger than the GND potential, that is, when (voltage between high voltage side floating supply offset voltage $V_S$ and GND)>(GND potential), the boost control circuit 202 turns off the N-type MOSFET 203 based on the signal from the $V_S$ potential detection circuit 206A. Furthermore, the BG control circuit 204 controls the voltage applied to the back gate terminal such that (voltage between back gate terminal and GND)= (voltage between power supply voltage $V_{CC}$ and GND).

According to the above-described operation, regardless of a magnitude relationship between (voltage between high voltage side floating supply offset voltage $V_S$ and GND) and (GND potential), a state of (voltage between back gate terminal and GND) (voltage between high voltage side floating supply absolute voltage $V_B$ and GND) can be maintained. Therefore, generation of a parasitic PNP transistor can be prevented.

Further, since the source terminal connected to the power supply voltage $V_{CC}$ is connected to the $N^+$-type contact layer 32 and the back gate terminal is connected to the $P^+$-type contact layer 20, if the voltage between the source terminal and the back gate terminal is large, the reverse withstand voltage of the PN junction cannot be maintained. Therefore, for example, by fixing (voltage between source terminal and back gate terminal) to 8 V (6.5 V at the minimum value), it is possible to maintain the reverse withstand voltage of the PN junction.

Seventh Preferred Embodiment

A semiconductor device according to the present preferred embodiment will be described. Note that, in the following description, the same components as those described in the above-described preferred embodiment are denoted by the same reference numerals, and detailed description thereof is appropriately omitted.

Based on the voltage value detected in the $V_S$ potential detection circuit 206A in FIG. 7, the bootstrap control circuit 200A can perform charging operation to the high voltage side floating supply absolute voltage $V_B$ of the high voltage side drive circuit 102 without depending on the drive input voltage $L_{IN}$ of the low voltage side drive circuit 104.

Specifically, when the voltage value detected in the $V_S$ potential detection circuit 206A is equal to or smaller than the GND potential, that is, when (voltage between high voltage side floating supply offset voltage $V_S$ and GND)≤ (GND potential), the boost control circuit 202 turns on the N-type MOSFET 203 based on a signal from the $V_S$ potential detection circuit 206A. Furthermore, the BG control circuit 204 controls a voltage applied to the back gate terminal such that (voltage between back gate terminal and GND)<(voltage between high voltage side floating supply absolute voltage $V_B$ and GND) and that (voltage between source terminal and back gate terminal)<(reverse withstand voltage of PN junction).

On the other hand, when the voltage value detected in the $V_S$ potential detection circuit 206A is larger than the GND potential, that is, when (voltage between high voltage side floating supply offset voltage $V_S$ and GND)>(GND potential), the boost control circuit 202 turns off the N-type MOSFET 203 based on the signal from the $V_S$ potential detection circuit 206A. Furthermore, the BG control circuit 204 controls the voltage applied to the back gate terminal such that (voltage between back gate terminal and GND)< (voltage between power supply voltage $V_{CC}$ and GND) and that (voltage between source terminal and back gate terminal)<(reverse withstand voltage of PN junction).

According to the above-described operation, regardless of a magnitude relationship between (voltage between high voltage side floating supply offset voltage $V_S$ and GND) and (GND potential), a state of (voltage between back gate terminal and GND)≤(voltage between high voltage side floating supply absolute voltage $V_B$ and GND) can be maintained. Therefore, generation of a parasitic PNP transistor can be prevented.

Further, since the source terminal connected to the power supply voltage $V_{CC}$ is connected to the $N^+$-type contact layer 32 and the back gate terminal is connected to the $P^+$-type contact layer 20, if the voltage between the source terminal and the back gate terminal is large, the reverse withstand voltage of the PN junction cannot be maintained. Therefore, for example, by fixing (voltage between source terminal and back gate terminal) to 8 V (6.5 V at the minimum value), the reverse withstand voltage of the PN junction can be maintained regardless of whether the MOSFET 203 is in a on state or off state.

<Effects Produced by Preferred Embodiments Described Above>

Next, examples of effects produced by the preferred embodiments described above are described. Note that, in the following description, although the effects are described based on the specific configuration whose example is shown in the preferred embodiment described above, as long as the same effects are produced, the configuration may be replaced with other specific configurations whose examples are shown in the present specification.

Further, the replacement may be performed on a plurality of preferred embodiments. In other words, there may be a case where configurations whose examples are shown in different preferred embodiments are combined to produce the same effects.

According to the preferred embodiment described above, a semiconductor device includes a first drive circuit and a bootstrap control circuit 200. Here, the first drive circuit corresponds to, for example, a high voltage side drive circuit 102. The high voltage side drive circuit 102 drives a first power device. Here, the first power device corresponds to, for example, an IGBT 106. The bootstrap control circuit 200 is connected to the high voltage side drive circuit 102. Then, in the high voltage side drive circuit 102, a voltage obtained by charging a power supply voltage $V_{CC}$ based on a GND potential is supplied to a capacitor connected between a $V_B$ terminal indicating a power supply voltage of the high voltage side drive circuit 102 and a $V_S$ terminal indicating a reference voltage of the high voltage side drive circuit 102. Here, the capacitor corresponds to, for example, a bootstrap capacitor 116. The bootstrap control circuit 200 also includes an N-type MOSFET 203, a boost control circuit 202, a back gate control circuit, and a $V_B$ potential detection circuit 206. Here, the back gate control circuit corresponds to, for example, a BG control circuit 204. The boost control circuit 202 is connected to a gate terminal of the MOSFET 203. The BG control circuit 204 is connected to a back gate terminal of the MOSFET 203. The $V_B$ potential detection circuit 206 is connected to the BG control circuit 204. Further, the $V_B$ potential detection circuit 206 detects a high voltage side floating supply absolute voltage $V_B$ which is a power supply voltage of the high voltage side drive circuit 102. A drain terminal of the MOSFET 203 is connected to the $V_B$ terminal. A source terminal of the MOSFET 203 is connected to the power supply voltage $V_{CC}$. When the high voltage side floating supply absolute voltage $V_B$ detected by the $V_B$ potential detection circuit 206 is equal to or smaller than the power supply voltage $V_{CC}$, the boost control circuit 202 turns on the MOSFET 203 by controlling a gate signal input to the gate terminal, and the BG control circuit 204 makes a voltage applied to the back gate terminal smaller than the high voltage side floating supply absolute voltage $V_B$.

According to such a configuration, an increase in consumption current of the power supply voltage is suppressed by preventing operation of a parasitic transistor by voltage control of the BG control circuit 204, and further, the power supply voltage of the high voltage side drive circuit 102 can be charged by turning on the N-type MOSFET 203 in the bootstrap control circuit 200.

Note that, even when at least one of the other configurations whose examples are shown in the present specification is appropriately added to the configuration described above, that is, even when the other configuration whose example is shown in the present specification and which is not mentioned as the configuration described above is appropriately added thereto, the same effects can be produced.

Further, according to the preferred embodiment described above, when the high voltage side floating supply absolute voltage $V_B$ detected by the $V_B$ potential detection circuit 206 is larger than the power supply voltage $V_{CC}$, the boost control circuit 202 turns off the MOSFET 203 by controlling the gate signal input to the gate terminal, and the BG control circuit 204 makes the voltage applied to the back gate terminal equal to the power supply voltage $V_{CC}$. According to such a configuration, regardless of a magnitude relationship between the high voltage side floating supply absolute voltage $V_B$ and the power supply voltage $V_{CC}$, a state of (voltage between back gate terminal and GND) (voltage between high voltage side floating supply absolute voltage $V_B$ and GND) can be maintained. Therefore, generation of a parasitic PNP transistor can be prevented.

Further, according to the preferred embodiment described above, when the high voltage side floating supply absolute voltage $V_B$ detected by the $V_B$ potential detection circuit 206 is equal to or smaller than the power supply voltage $V_{CC}$, the BG control circuit 204 controls the voltage applied to the back gate terminal such that a difference between a voltage applied to the source terminal and the voltage applied to the back gate terminal is smaller than a reverse withstand voltage of a PN junction. According to such a configuration, when the high voltage side floating supply absolute voltage $V_B$ is equal to or smaller than the power supply voltage $V_{CC}$, the reverse withstand voltage of the PN junction can be maintained.

Further, according to the preferred embodiment described above, when the high voltage side floating supply absolute voltage $V_B$ detected by the $V_B$ potential detection circuit 206 is larger than the power supply voltage $V_{CC}$, the BG control circuit 204 controls the voltage applied to the back gate terminal so that the voltage applied to the back gate terminal is smaller than the power supply voltage $V_{CC}$ and that the difference between the voltage applied to the source terminal and the voltage applied to the back gate terminal is smaller than the reverse withstand voltage of the PN junction. According to such a configuration, regardless of a magnitude relationship between the high voltage side floating supply absolute voltage $V_B$ and the power supply voltage $V_{CC}$, the reverse withstand voltage of the PN junction can be maintained.

Further, according to the preferred embodiment described above, the semiconductor device includes a second drive circuit for driving a second power device on a lower voltage side than the first power device. Here, the second power device corresponds to an IGBT 108, for example. Further, the second drive circuit corresponds to, for example, a low voltage side drive circuit 104. Then, the low voltage side drive circuit 104 is supplied with the power supply voltage $V_{CC}$. According to such a configuration, by charging the bootstrap capacitor 116 via the MOSFET 203, a configuration can be made in which a floating power supply is not separately provided on a high voltage side floating supply absolute voltage $V_B$ side.

Further, according to the preferred embodiment described above, a semiconductor device includes a high voltage side drive circuit 102 and a bootstrap control circuit 200A. The high voltage side drive circuit 102 drives an IGBT 106. The bootstrap control circuit 200A is connected to the high voltage side drive circuit 102. Then, in the high voltage side drive circuit 102, a voltage obtained by charging a power supply voltage $V_{CC}$ based on a GND potential is supplied to a bootstrap capacitor 116 connected between a $V_B$ terminal indicating a power supply voltage of the high voltage side drive circuit 102 and a $V_S$ terminal indicating a reference voltage of the high voltage side drive circuit 102. The bootstrap control circuit 200A further includes an N-type MOSFET 203, a boost control circuit 202, a BG control circuit 204, and a $V_S$ potential detection circuit 206A. The boost control circuit 202 is connected to a gate terminal of the MOSFET 203. The BG control circuit 204 is connected to a back gate terminal of the MOSFET 203. The $V_S$ potential detection circuit 206A is connected to the BG control circuit 204. Further, the $V_S$ potential detection circuit 206A detects a high voltage side floating supply offset voltage $V_S$ which is a reference voltage of the high voltage side drive circuit 102. A drain terminal of the MOSFET 203 is connected to the $V_B$ terminal. A source terminal of the MOSFET 203 is connected to the power supply voltage $V_{CC}$. When the high voltage side floating supply offset voltage $V_S$ detected by the $V_S$ potential detection circuit 206A is equal to or smaller than the GND potential, the boost control circuit 202 turns on the MOSFET 203 by controlling a gate signal input to the gate terminal, and the BG control circuit 204 makes a voltage applied to the back gate terminal smaller than the high voltage side floating supply absolute voltage $V_B$.

According to such a configuration, an increase in consumption current of the power supply voltage is suppressed by preventing operation of a parasitic transistor by voltage control of the BG control circuit 204, and further, the power supply voltage of the high voltage side drive circuit 102 can be charged by turning on the N-type MOSFET 203 in the bootstrap control circuit 200A.

Further, according to the preferred embodiment described above, when the high voltage side floating supply offset voltage $V_S$ detected by the $V_S$ potential detection circuit 206A is larger than the GND potential, the boost control circuit 202 turns off the MOSFET 203 by controlling the gate signal input to the gate terminal, and the BG control circuit 204 makes the voltage applied to the back gate terminal equal to the power supply voltage $V_{CC}$. According to such a configuration, regardless of a magnitude relationship between the high voltage side floating supply offset voltage $V_S$ and the GND potential, a state of (voltage between back gate terminal and GND)≤(voltage between high voltage side floating supply absolute voltage $V_B$ and GND) can be maintained. Therefore, generation of a parasitic PNP transistor can be prevented.

Further, according to the preferred embodiment described above, when the high voltage side floating supply offset voltage $V_S$ detected by the $V_S$ potential detection circuit 206A is equal to or smaller than the GND potential, the BG control circuit 204 controls the voltage applied to the back gate terminal such that a difference between a voltage applied to the source terminal and the voltage applied to the back gate terminal is smaller than a reverse withstand voltage of a PN junction. According to such a configuration, when the high voltage side floating supply offset voltage $V_S$ is equal to or smaller than the GND potential, the reverse withstand voltage of the PN junction can be maintained.

Further, according to the preferred embodiment described above, when the high voltage side floating supply offset voltage $V_S$ detected by the $V_S$ potential detection circuit 206A is larger than the GND potential, the BG control circuit 204 controls the voltage applied to the back gate terminal so that the voltage applied to the back gate terminal is smaller than the power supply voltage $V_{CC}$ and that the difference between the voltage applied to the source terminal and the voltage applied to the back gate terminal is smaller than the reverse withstand voltage of the PN junction. According to such a configuration, regardless of a magnitude relationship between the high voltage side floating supply offset voltage $V_S$ and the GND potential, the reverse withstand voltage of the PN junction can be maintained.

Further, according to the preferred embodiment described above, the semiconductor device includes a low voltage side drive circuit 104 that drives an IGBT 108 on a lower voltage side than the first power device. Then, the low voltage side drive circuit 104 is supplied with the power supply voltage $V_{CC}$. According to such a configuration, by charging the bootstrap capacitor 116 via the MOSFET 203, a configuration can be made in which a floating power supply is not separately provided on a high voltage side floating supply absolute voltage $V_B$ side.

<Modifications of Preferred Embodiments Described Above>

Although material qualities, materials, dimensions, shapes, relative arrangement relationships of components, conditions of implementation, etc. may also be described in the preferred embodiments described above, these are examples in all aspects, and are not limited to those described in the present specification.

Accordingly, numerous modifications and equivalents whose examples are not shown are contemplated within the scope of the technique disclosed in the present specification. For example, a case where at least one component is deformed, added or omitted, and further, a case where at least one component in at least one preferred embodiment is extracted and combined with components of another preferred embodiment shall be included.

Also, as long as no contradiction arises, it is assumed that "one or more" may be provided for the component described as being "one" in the preferred embodiments described above.

Furthermore, each component in the preferred embodiments described above is a conceptual unit, and within the scope of the technique disclosed in the present specification, a case where one component is composed of a plurality of structures, a case where one component corresponds to a part of a certain structure, and furthermore, a case where plural components are provided in one structure are included.

In addition, each component in the preferred embodiments described above includes a structure having another structure or shape as long as the same function is exerted.

In addition, the description in the present specification is referred to for all purposes relating to the present technique, none of which is deemed to be prior art.

Further, in the preferred embodiments described above, when a material name or the like is described without being specified, unless the contradiction arises, the material includes other additives, for example, an alloy or the like.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a first drive circuit for driving a first power device; and
a bootstrap control circuit connected to the first drive circuit,
wherein in the first drive circuit, a voltage obtained by charging a supply voltage $V_{CC}$ based on a GND potential is supplied to a capacitor connected between a $V_B$ terminal indicating a power supply voltage of the first drive circuit and a $V_S$ terminal indicating a reference voltage of the first drive circuit,
the bootstrap control circuit includes
an N-type MOSFET,
a boost control circuit connected to a gate terminal of the MOSFET,
a back gate control circuit having an output connected to a back gate terminal of the MOSFET, and
a $V_B$ potential detection circuit connected to an input of the back gate control circuit and for detecting a voltage $V_B$ which is the power supply voltage of the first drive circuit,
a drain terminal of the MOSFET is connected to the $V_B$ terminal,
a source terminal of the MOSFET is connected to the power supply voltage $V_{CC}$, and
when the voltage $V_B$ detected by the $V_B$ potential detection circuit is equal to or smaller than the power supply voltage $V_{CC}$, the boost control circuit turns on the MOSFET by controlling a gate signal input to the gate terminal, and the back gate control circuit makes the voltage applied to the back gate terminal smaller than the voltage $V_B$.

2. The semiconductor device according to claim 1, wherein when the voltage $V_B$ detected by the $V_B$ potential detection circuit is larger than the power supply voltage $V_{CC}$, the boost control circuit turns off the MOSFET by controlling the gate signal input to the gate terminal, and the back gate control circuit makes the voltage applied to the back gate terminal equal to the power supply voltage $V_{CC}$.

3. The semiconductor device according to claim 1, wherein when the voltage $V_B$ detected by the $V_B$ potential detection circuit is equal to or smaller than the power supply voltage $V_{CC}$, the back gate control circuit controls the voltage applied to the back gate terminal such that a difference between a voltage applied to the source terminal and the voltage applied to the back gate terminal is smaller than a reverse withstand voltage of a PN junction.

4. The semiconductor device according to claim 1, wherein when the voltage $V_B$ detected by the $V_B$ potential detection circuit is larger than the power supply voltage $V_{CC}$, the back gate control circuit controls the voltage applied to the back gate terminal such that the voltage applied to the back gate terminal is smaller than the power supply voltage $V_{CC}$ and that the difference between the voltage applied to the source terminal and the voltage applied to the back gate terminal is smaller than the reverse withstand voltage of the PN junction.

5. The semiconductor device according to claim 1, further comprising:
a second drive circuit for driving a second power device on a lower voltage side than the first power device, wherein the second drive circuit is supplied with the power supply voltage $V_{CC}$.

6. The semiconductor device according to claim 1, wherein
the back gate control circuit is configured to control a voltage applied to the back gate terminal to be at different magnitudes depending on the voltage $V_B$ detected by the $V_B$ potential detection circuit in relation to the power supply voltage $V_{CC}$.

7. A semiconductor device comprising:
a first drive circuit for driving a first power device; and
a bootstrap control circuit connected to the first drive circuit,
wherein in the first drive circuit, a voltage obtained by charging a supply voltage $V_{CC}$ based on a GND potential is supplied to a capacitor connected between a $V_B$ terminal indicating a power supply voltage of the first drive circuit and a $V_S$ terminal indicating a reference voltage of the first drive circuit,
the bootstrap control circuit includes
an N-type MOSFET,
a boost control circuit connected to a gate terminal of the MOSFET,
a back gate control circuit connected to a back gate terminal of the MOSFET, and
a $V_S$ potential detection circuit connected to the back gate control circuit and for detecting a voltage $V_S$ which is the reference voltage of the first drive circuit,
a drain terminal of the MOSFET is connected to the $V_B$ terminal,
a source terminal of the MOSFET is connected to the power supply voltage $V_{CC}$, and
when the voltage $V_S$ detected by the $V_S$ potential detection circuit is equal to or smaller than the GND potential, the boost control circuit turns on the MOSFET by controlling a gate signal input to the gate terminal, and the back gate control circuit makes a voltage applied to the back gate terminal smaller than the voltage $V_B$.

8. The semiconductor device according to claim 7, wherein when the voltage $V_S$ detected by the $V_S$ potential detection circuit is larger than the GND potential, the boost control circuit turns off the MOSFET by controlling the gate signal input to the gate terminal, and the back gate control circuit makes the voltage applied to the back gate terminal equal to the power supply voltage $V_{CC}$.

9. The semiconductor device according to claim 7, wherein when the voltage $V_S$ detected by the $V_S$ potential detection circuit is equal to or smaller than the GND potential, the back gate control circuit controls the voltage applied to the back gate terminal such that a difference between a voltage applied to the source terminal and the voltage applied to the back gate terminal is smaller than a reverse withstand voltage of a PN junction.

10. The semiconductor device according to claim 7, wherein when the voltage $V_S$ detected by the $V_S$ potential detection circuit is larger than the GND potential, the back gate control circuit controls the voltage applied to the back gate terminal such that the voltage applied to the back gate terminal is smaller than the power supply voltage $V_{CC}$ and that the difference between the voltage applied to the source terminal and the voltage applied to the back gate terminal is smaller than the reverse withstand voltage of the PN junction.

11. The semiconductor device according to claim 7, further comprising:
   a second drive circuit for driving a second power device on a lower voltage side than the first power device,
   wherein the second drive circuit is supplied with the power supply voltage $V_{CC}$.

* * * * *